United States Patent
Chao et al.

(10) Patent No.: US 10,715,172 B1
(45) Date of Patent: Jul. 14, 2020

(54) ANALOG-TO-DIGITAL CONVERTER WITH ADJUSTABLE OPERATION FREQUENCY FOR NOISE REDUCTION

(71) Applicant: HYCON TECHNOLOGY CORP., Taipei (TW)

(72) Inventors: Po-Yin Chao, Taipei (TW); Hung-Wei Chen, Taipei (TW); Shui-Chu Lee, Taipei (TW)

(73) Assignee: HYCON TECHNOLOGY CORP, Taipei (TW)

( * ) Notice: Subject to any disclaimer, the term of this patent is extended or adjusted under 35 U.S.C. 154(b) by 0 days.

(21) Appl. No.: 16/460,516

(22) Filed: Jul. 2, 2019

(51) Int. Cl.
*H03M 3/00* (2006.01)
*H03M 1/12* (2006.01)

(52) U.S. Cl.
CPC ......... *H03M 3/368* (2013.01); *H03M 1/1245* (2013.01); *H03M 3/422* (2013.01); *H03M 3/494* (2013.01)

(58) Field of Classification Search
None
See application file for complete search history.

(56) References Cited

U.S. PATENT DOCUMENTS

| | | | |
|---|---|---|---|
| 6,329,938 B1 * | 12/2001 | Spaur | H03M 1/462 341/118 |
| 6,593,871 B1 * | 7/2003 | Miethig | H03M 1/1255 341/155 |
| 10,148,281 B1 | 12/2018 | Kurose | |
| 2008/0204300 A1 * | 8/2008 | Tachibana | H03M 1/462 341/158 |

FOREIGN PATENT DOCUMENTS

| | | |
|---|---|---|
| TW | I309510 | 2/2006 |
| TW | 201014182 | 4/2010 |

OTHER PUBLICATIONS

Taiwan Office Action for Application No. 108117369 dated Oct. 4, 2019.
Taiwan Search Report for Application No. 108117369 dated Oct. 4, 2019.

* cited by examiner

*Primary Examiner* — Howard Williams
(74) *Attorney, Agent, or Firm* — Demian K. Jackson; Jackson IPG PLLC

(57) ABSTRACT

Disclosed is an analog-to-digital converter with an adjustable operation frequency for noise reduction. The operation frequency of the analog-to-digital converter is adjustable, and if an input signal or a circuit is affected by a noise, the noise can be reduced by spreading the frequency distribution of the noise. A clock generator generates a clock signal for controlling the operation frequency of the analog-to-digital converter. Additionally, a clock controller receives a setting signal and a counting signal, controls the clock generator, and adjusts the frequency of the clock signal. In addition, a counter counts the number of periods of the clock signal, and generates the counting signal. Furthermore, a selecting signal makes the frequency of the clock signal gradually increase or decrease with time, thereby allowing change rate or change amount of the frequency of the clock signal to be adjustable.

25 Claims, 5 Drawing Sheets

ANALOG-TO-DIGITAL CONVERTER WITH ADJUSTABLE OPERATION FREQUENCY FOR NOISE REDUCTION

FIELD OF THE INVENTION

The present invention relates to an analog-to-digital converter, and more particularly to an analog-to-digital converter capable of adjusting an operating frequency, thereby reducing noise of an output signal of the analog-to-digital converter.

BACKGROUND OF THE INVENTION

An analog-to-digital converter is widely used in various electronic components to convert continuous analog signals into discrete digital signals, such as converting analog signals of various sensors into digital output signals. However, an analog-to-digital converter has a problem in that an offset caused during analog signal sampling and a quantization error caused during digital signal conversion will affect the accuracy of the analog-to-digital converter. In addition, when an input signal or a related circuit is disturbed, the ability to resist noise also influences the performance of an analog-to-digital converter.

Taiwanese Patent No. I330,467 discloses an analog digital conversion device applied to orthogonal frequency division multiplexing and ultra-wideband, wherein a frequency difference is complemented or reduced, and a signal is modulated to increase ratio of signal to quantization noise (SQNR) by about 5 dB.

U.S. Pat. No. 9,455,733 discloses an analog-to-digital converter with an adjustable sampling frequency wherein pseudo-noise sequence is used for modulation. However, the above two modulations need demodulation circuits.

Taiwanese Patent No. I404,345 discloses a sigma-delta modulator with a controllable output rate, wherein the output rate of the sigma-delta modulator is controlled according to an amplitude of an input signal, and a period of a first clock is multiplied by an integer as an adjusted operating frequency. However, resistance to noise is not enhanced.

SUMMARY OF THE INVENTION

The present invention discloses an analog-to-digital converter with an adjustable operation frequency, which includes an analog-to-digital conversion unit, a clock generator, a clock controller and a counter. The analog-to-digital conversion unit receives an analog signal, and converts the received analog signal into a digital quantized signal. The clock generator generates a clock signal for controlling an operation speed of the analog-to-digital conversion unit. The clock controller receives a setting signal and a counting signal, and generates a control signal for controlling the clock generator and adjusting a frequency of the clock signal. The counter counts output times of the clock signal, and generates the counting signal based on the counted result.

According to the inventive analog-to-digital converter with an adjustable operation frequency, the clock controller receives a selecting signal and an enable signal. The selecting signal adjusts change rate or change amount of the control signal based on the counting signal and then generates a modulation signal. The enable signal uses either the setting signal or the modulation signal as the control signal.

According to the inventive analog-to-digital converter with an adjustable operation frequency, since output times of the clock signal are counted by the counter, the generated counting signal gradually increases or decreases with time, and the modulation signal generated by the clock controller also gradually increases or decreases with time. If the enable signal selects the modulation signal as the control signal, frequency of the clock signal would gradually increases or decreases with time. On the other hand, if the enable signal selects the setting signal as the control signal, the clock signal has a constant frequency.

According to the inventive analog-to-digital converter with an adjustable operation frequency, the clock controller further includes a first multiplexer, an adder and a second multiplexer. The first multiplexer outputs a modulation value based on the counting signal and the selecting signal. The setting signal and the modulation value are added by the adder to obtain the modulation signal. The second multiplexer selects either the setting signal or the modulation signal based on the enable signal as the control signal.

According to the inventive analog-to-digital converter with an adjustable operation frequency, the analog-to-digital conversion unit includes a sample and hold circuit and a quantizer. The sample and hold circuit samples and holds the analog signal. The quantizer converts an output signal from the sample and hold circuit into the digital quantized signal.

According to the inventive analog-to-digital converter with an adjustable operation frequency, the analog-to-digital conversion unit includes a sample and hold circuit, an integrator, a quantizer and a feedback circuit. The sample and hold circuit samples and holds the analog signal. An output signal from the sample and hold circuit is integrated by the integrator. The quantizer converts an output signal from the integrator into the digital quantized signal. The feedback circuit generates a feedback signal based on the digital quantized signal to control the sample and hold circuit.

The inventive analog-to-digital converter with an adjustable operation frequency further includes a filter or a stable processor for filtering or stabilizing the digital quantized signal. On the other hand, the converter can include both a filter and a stable processor. An output from the analog-to-digital conversion unit is filtered by the filter. The stable processor is connected to an end of the filter or connected between the analog-to-digital conversion unit and the filter, and stabilizes an output from the filter or an output from the analog-to-digital conversion unit.

According to the inventive analog-to-digital converter with an adjustable operation frequency, the stable processor is provided with a stable input signal, a stable output signal, a stable threshold and a stable ratio. The stable input signal is inputted to the stable processor. The stable output signal is outputted from the stable processor. When the stable input signal is varied, a stable input signal variation is generated. When the stable output signal is varied, a stable output signal variation is generated. When a difference between the stable input signal and the stable output signal is varied, an input-output signal variation is generated. The stable threshold is compared with the stable input signal variation, the stable output signal variation, or the input-output signal variation. If the stable input signal variation, the stable output signal variation or the input-output signal variation is higher than the stable threshold, an intermediate signal ranging between the stable input signal and the stable output signal is obtained based on the stable input signal, the stable output signal and the stable ratio to replace the stable output signal.

According to the inventive analog-to-digital converter with an adjustable operation frequency, the stable processor subtracts the stable output signal from the stable input signal, divides the subtraction result by the stable ratio, adds it to the stable output signal, and then replace the stable output signal with the resultant value.

According to the inventive analog-to-digital converter with an adjustable operation frequency, the stable threshold has a predetermined value or is obtained based on the variation in the stable input signal or the stable output signal.

According to the inventive analog-to-digital converter with an adjustable operation frequency, the stable processor includes an input terminal having a stable input signal, an output terminal having a stable output signal, a stable calculator, a third multiplexer, a first register, a second register, and a subtract and compare circuit. The stable calculator obtains an intermediate signal ranging between the stable input signal and the stable output signal is obtained based on the stable input signal, the stable output signal and a stable ratio. The third multiplexer outputs either the stable input signal or an output from the stable calculator based on a stable enable signal. The first register stores an output from the third multiplexer under control of the clock signal, and uses either the output from the third multiplexer or an output from the first register as the stable output signal. The second register stores the stable input signal under control of the clock signal. The subtract and compare circuit subtracts an output of the second register from the stable input signal, compares the subtraction result with a stable threshold, and generates a stable enable signal. The third multiplexer selects the output from the stable calculator as an input to the first register when the subtraction result is higher than the stable threshold. On the other hand, the third multiplexer selects the stable input signal as an input to the first register when the subtraction result is equal to or lower than the stable threshold.

According to the inventive analog-to-digital converter with an adjustable operation frequency, the stable processor further includes a stable judgment circuit. The stable judgment circuit includes one or more registers in cascade and a judgment logic circuit. The one or more registers store a comparison result from the subtract and compare circuit under control of the clock signal. The judgment logic circuit generates a stable enable signal based on the output from the subtract and compare circuit and outputs from the one or more registers. The third multiplexer selects the output from the stable calculator as an input to the first register when the subtraction result is higher than the stable threshold; otherwise, the third multiplexer selects the stable input signal as an input to the first register.

This paragraph extracts and compiles some features of the present invention; other features will be disclosed in the follow-up paragraphs. It is intended to cover various modifications and similar arrangements included within the spirit and scope of the appended claims.

DETAILED DESCRIPTION OF THE PREFERRED EMBODIMENTS

The present invention will now be described more specifically with reference to the following embodiments. Please note that the following description of embodiments of the invention is intended to be merely illustrative. This is not meant to be an exhaustive description of the invention or limited to the form of the disclosure.

Figure 1:
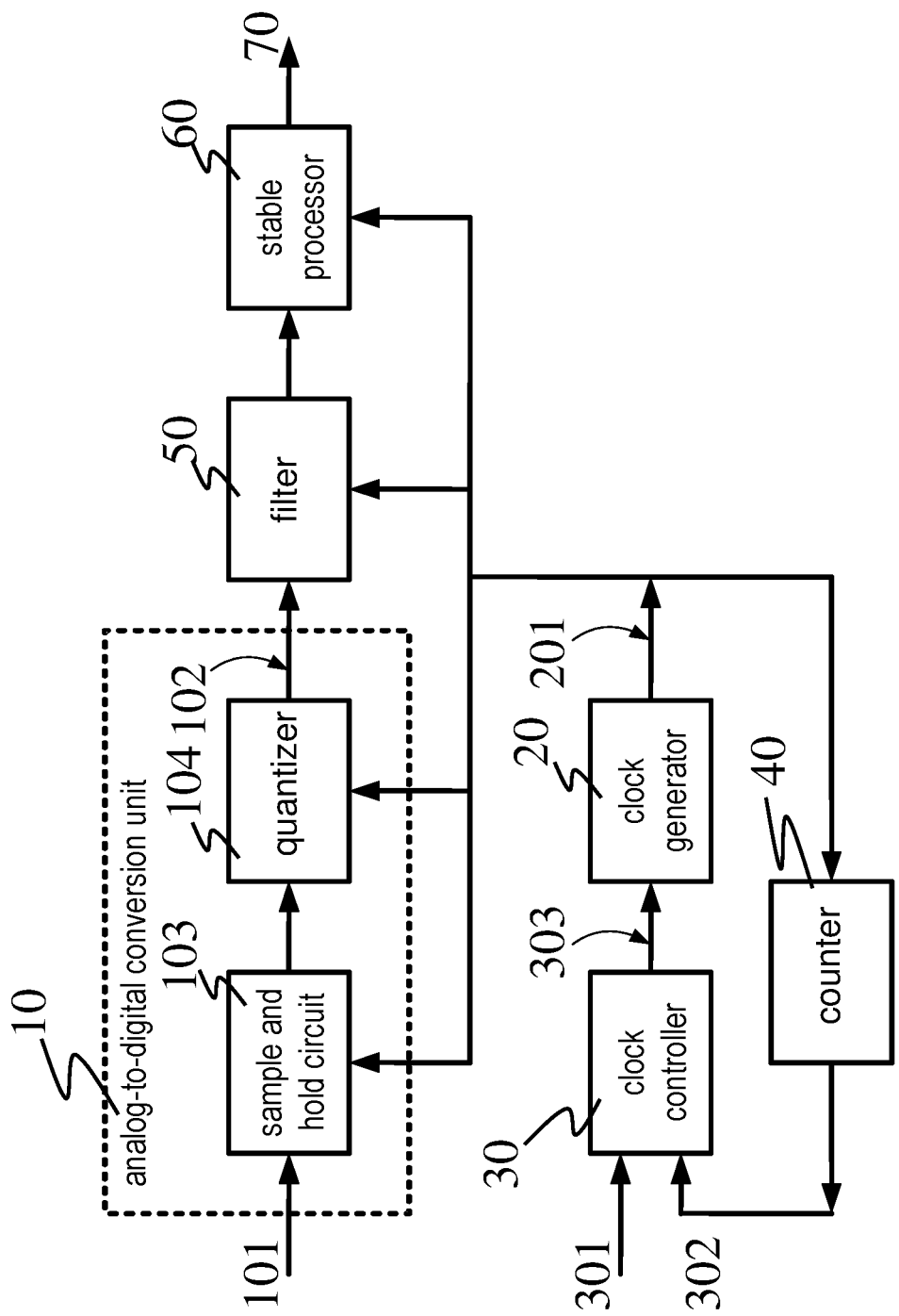
FIG. 1 illustrates an analog-to-digital converter with an adjustable operation frequency according to the first embodiment the present invention.

FIG. 1 shows the first embodiment of the present invention in which an analog-to-digital converter with an adjustable operation frequency includes an analog-to-digital conversion unit 10, a clock generator 20, a clock controller 30, a counter 40, a filter 50, and a stable processor 60. The analog-to-digital conversion unit 10 receives an analog signal 101 and converts the received analog signal 101 into a digital quantized signal 102. The clock generator 20 generates a clock signal 201 for controlling operation speed of the analog-to-digital conversion unit 10. The clock controller 30 receives a setting signal 301 and a counting signal 302, and generates a control signal 303 for controlling the clock generator 20 and adjusting the frequency of the clock signal 201. The counter 40 counts output times of the clock signal 201, and generates the counting signal 302 based on the counted result. The filter 50 filters an output from the analog-to-digital conversion unit 10. An output from the filter 50 is stabilized by the stable processor 60 connected to an end of the filter 50 to obtain a filter and stable output signal 70.

In the analog-to-digital converter with an adjustable operation frequency, the stable processor 60 can be connected between the analog-to-digital conversion unit 10 and the filter 50 to stabilize an output from the analog-to-digital conversion unit 10, and then an output from the stable processor 60 is filtered by the filter 50 to obtain the filter and stable output signal 70.

Figure 2:
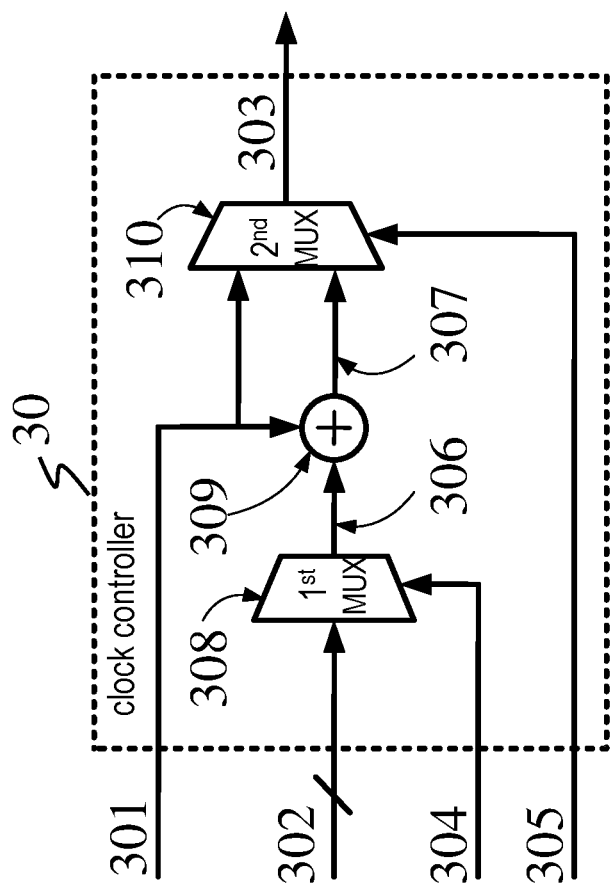
FIG. 2 illustrates a structure of the clock controller in FIG. 1.

In the analog-to-digital converter with an adjustable operation frequency, the clock controller 30 is provided with a selecting signal 304 and an enable signal 305, as shown in FIG. 2. The selecting signal 304 adjusts change rate or change amount of the control signal 303 based on the counting signal 302, and generates a modulation signal 307. The enable signal 305 selects the setting signal 301 or the modulation signal 307 as the control signal 303.

In the analog-to-digital converter with an adjustable operation frequency, output times of the clock signal 201 is counted by the counter 40, and thus the counting signal 302 is gradually increased or decreased with time. The modulation signal 307 generated by the clock controller 30 is also gradually increased or decreased with time. If the enable signal 305 selects the modulation signal 307 as the control signal 303, frequency of the clock signal 201 is gradually increased or decreased with time. On the other hand, if the enable signal 305 selects the setting signal 301 as the control signal 303, the clock signal 201 has a constant frequency.

In the analog-to-digital converter with an adjustable operation frequency, the clock controller 30 further includes a first multiplexer 308, an adder 309 and a second multiplexer 310. The first multiplexer 308 outputs a modulation value 306 based on the counting signal 302 and the selecting signal 304. The adder 309 obtains the modulation signal 307 by adding the setting signal 301 and the modulation value 306. The second multiplexer 310 selects either the setting signal 301 or the modulation signal 307 as the control signal 303 based on the enable signal 305.

In the analog-to-digital converter with an adjustable operation frequency, the analog-to-digital conversion unit 10 includes a sample and hold circuit 103 and a quantizer 104. The sample and hold circuit 103 samples and holds the analog signal 101. The quantizer 104 converts an analog signal outputted by the sample and hold circuit 103 into the digital quantized signal 102.

Figure 3:
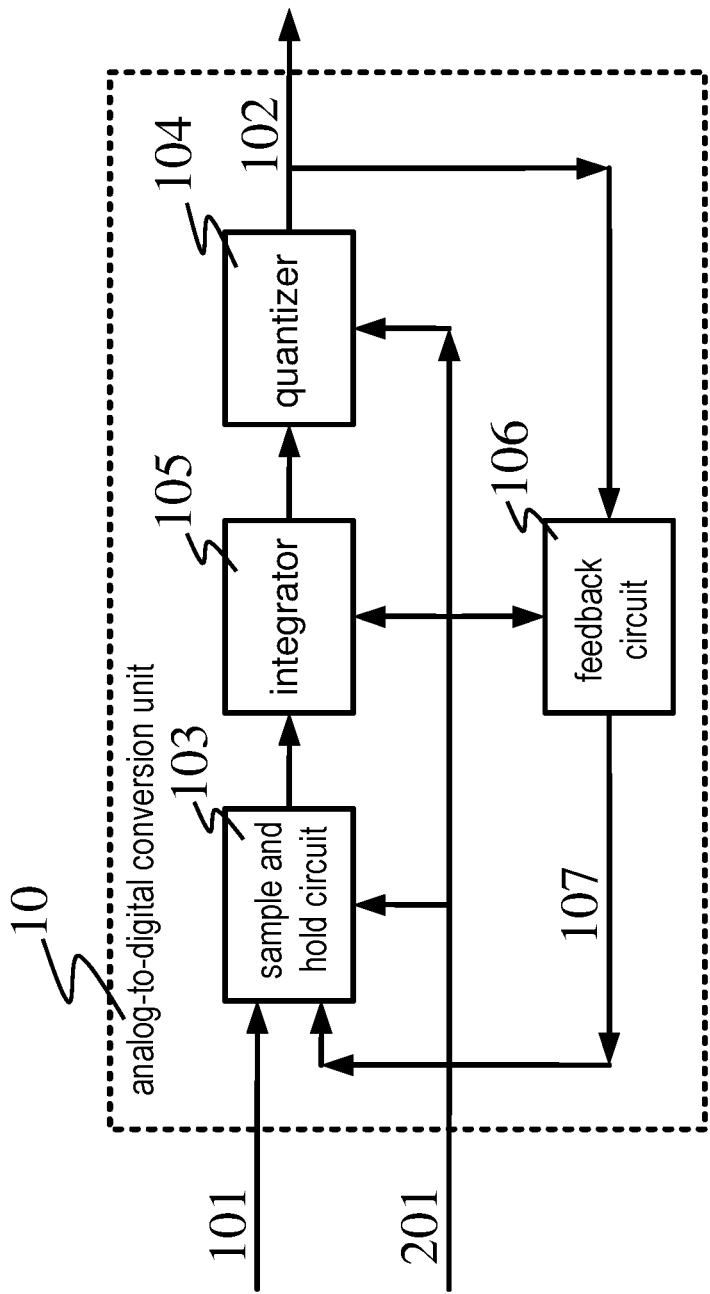
FIG. 3 illustrates another analog-to-digital conversion unit different from that in FIG. 1.

In the analog-to-digital converter with an adjustable operation frequency, the analog-to-digital conversion unit 10 includes a sample and hold circuit 103, an integrator 105, a quantizer 104 and a feedback circuit 106, as shown in FIG. 3. The sample and hold circuit 103 samples and holds the analog signal 101. An output signal from the sample and hold circuit 103 is integrated by the integrator 105. The quantizer 104 converts an output signal from the integrator 105 into the digital quantized signal 102. The feedback circuit 106 generates a feedback signal 107 based on the digital quantized signal 102 to control the sample and hold circuit 103.

In the analog-to-digital converter with an adjustable operation frequency, the analog-to-digital conversion unit 10 is a sigma-delta analog-to-digital converter. When the analog signal 101 is subjected to noise interference, adjusting the frequency of the clock signal 201 can disperse the frequency distribution of the noise, and the noise frequency distribution is effective for various analog digital converters. The sigma-delta analog-to-digital converter can modulate the noise frequency distribution into a higher frequency. Then the filter 50 or the stable processor 60 is provided to further suppress the noise.

Figure 4:
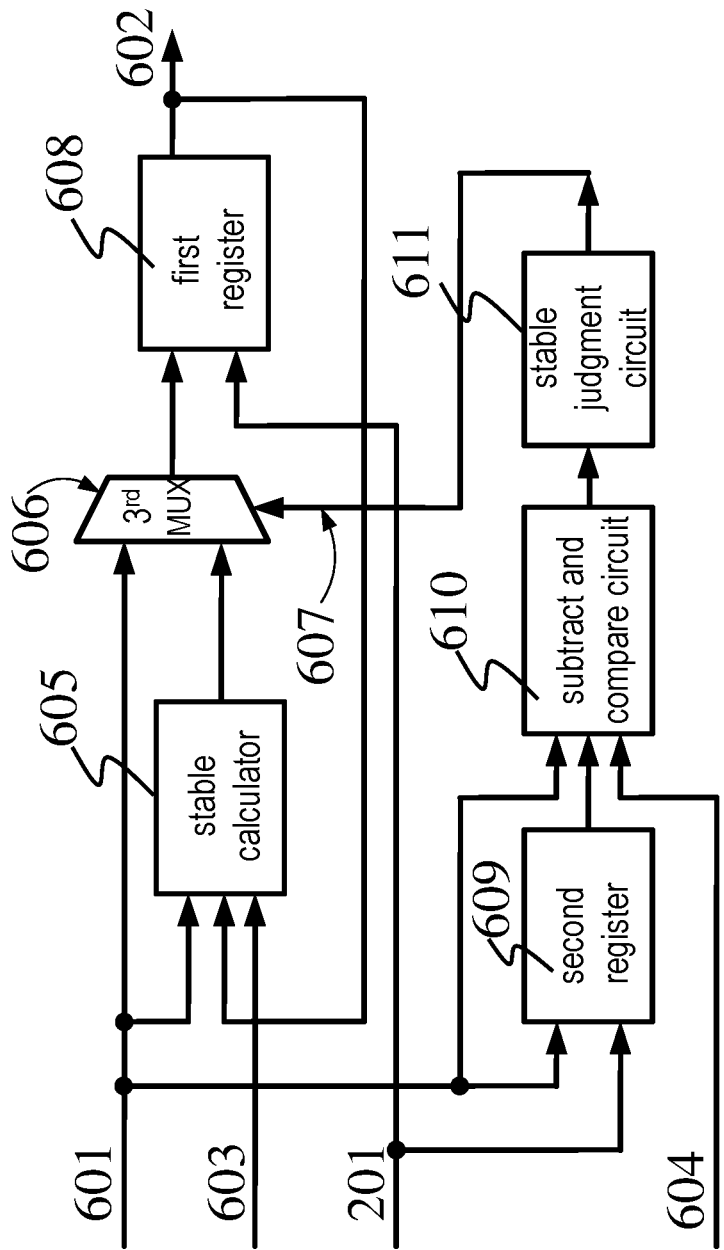
FIG. 4 illustrates a structure of the stable processor in FIG. 1.

In the analog-to-digital converter with an adjustable operation frequency, the stable processor 60 is provided with a stable input signal 601, a stable output signal 602, a stable threshold 604 and a stable ratio 603, as shown in FIG. 4. The stable input signal 601 is an input to the stable processor 60. The stable output signal 602 is an output of the stable processor 60. The stable threshold 604 is compared with variation in the stable input signal 601 or the stable output signal 602. If the variation of the stable input signal 601 or the stable output signal 602 is higher than the stable threshold 604, an intermediate signal ranging between the stable input signal 601 and the stable output signal 602 is obtained based on the stable ratio 603, the stable input signal 601 and the stable output signal 602, so as to replace the stable output signal 602.

In the analog-to-digital converter with an adjustable operation frequency, the stable processor 60 subtracts the stable output signal 602 from the stable input signal 601, divides the subtraction result by the stable ratio 603, adds it to the stable output signal 602, and replaces the stable output signal 602 with the above calculation result. For example, when the stable input signal 601 has a value of Din, the stable output signal 602 has a value of Dout, and the stable ratio 603 has a value of R, in which R is larger than 1, the value of the stable output signal 602 will be replaced with $[Dout+((Din-Dout)/R)]$. If R=10, the variation of the replaced Dout is $[(Din-Dout)/R]$, which is one tenth of the original variation $[Din-Dout]$.

According to the analog-to-digital converter with an adjustable operation frequency, comparison of the stable threshold 604 with variation of the stable input signal 601 or the stable output signal 602 is explained as below. The stable input signal 601 has a value of Din, the stable output signal 602 has a value of Dout, and the stable threshold 604 has a value of Dth. On one hand, the stable output signal 602 is subtracted from the stable input signal 601, and then difference $[Din-Dout]$ is compared with stable threshold 604. On the other hand, the last value of the stable input signal 601 can be subtracted from the current value, and then the difference $[Din(n)-Din(n-1)]$ is compared with the stable threshold 604. Similarly, the last value of the stable output signal 602 can be subtracted from the current value, and then the difference $[Dout(n)-Dout(n-1)]$ is compared with the stable threshold 604. Alternatively, the last value of the stable input signal 601 or the stable output signal 602 can be subtracted from the current value of the stable output signal 602 or the stable input signal 601, and then the difference $[Din(n)-Dout(n-1)]$ or $[Dout(n)-Din(n-1)]$ is compared with the stable threshold 604.

According to the analog-to-digital converter with an adjustable operation frequency, the stable threshold 604 has a predetermined value, or has a value determined by variation of the stable input signal 601 or the stable output signal 602. For example, the above-mentioned difference $[Din(n)-Din(n-1)]$, $[Din(n)-Dout(n-1)]$, $[Dout(n)-Din(n-1)]$ or $[Dout(n)-Dout(n-1)]$ between the last stable input signal 601 or the last stable output signal 602 and the current stable output signal 602 or the current stable input signal 601 is obtained, and then the stable threshold 604 is determined by average of the difference over a period of time. The stable threshold 604 can also be determined by the maximum value of the above difference.

In the analog-to-digital converter with an adjustable operation frequency, the stable processor 60 further includes a stable calculator 605, a third multiplexer 606, a first register 608, a second register 609 and a subtract and compare circuit 610. The stable calculator 605 obtains an intermediate signal ranging between the stable input signal 601 and the stable output signal 602 based on the stable input signal 601, the stable output signal 602 and a stable ratio 603. The third multiplexer 606 outputs either the stable input signal 601 or an output from the stable calculator 605 based on a stable enable signal 607. The first register 608 stores the output from the third multiplexer 606 under control of the clock signal 201, and uses the output from the third multiplexer 606 or an output from the first register 608 as the stable output signal 602. The second register 609 stores the stable input signal 601 under control of the clock signal 201. The subtract and compare circuit 610 obtains a difference $[Din(n)-Din(n-1)]$ between the stable input signal 601 and an output from the second register 609, and the difference is compared with the stable threshold 604 to generate a stable enable signal 607. If the difference is higher than the stable threshold 604, the third multiplexer 606 selects the output from the stable calculator 605 as an input to the first register 608. Otherwise, the third multiplexer 606 selects the stable input signal 601 as an input to the first register 608.

Figure 5:
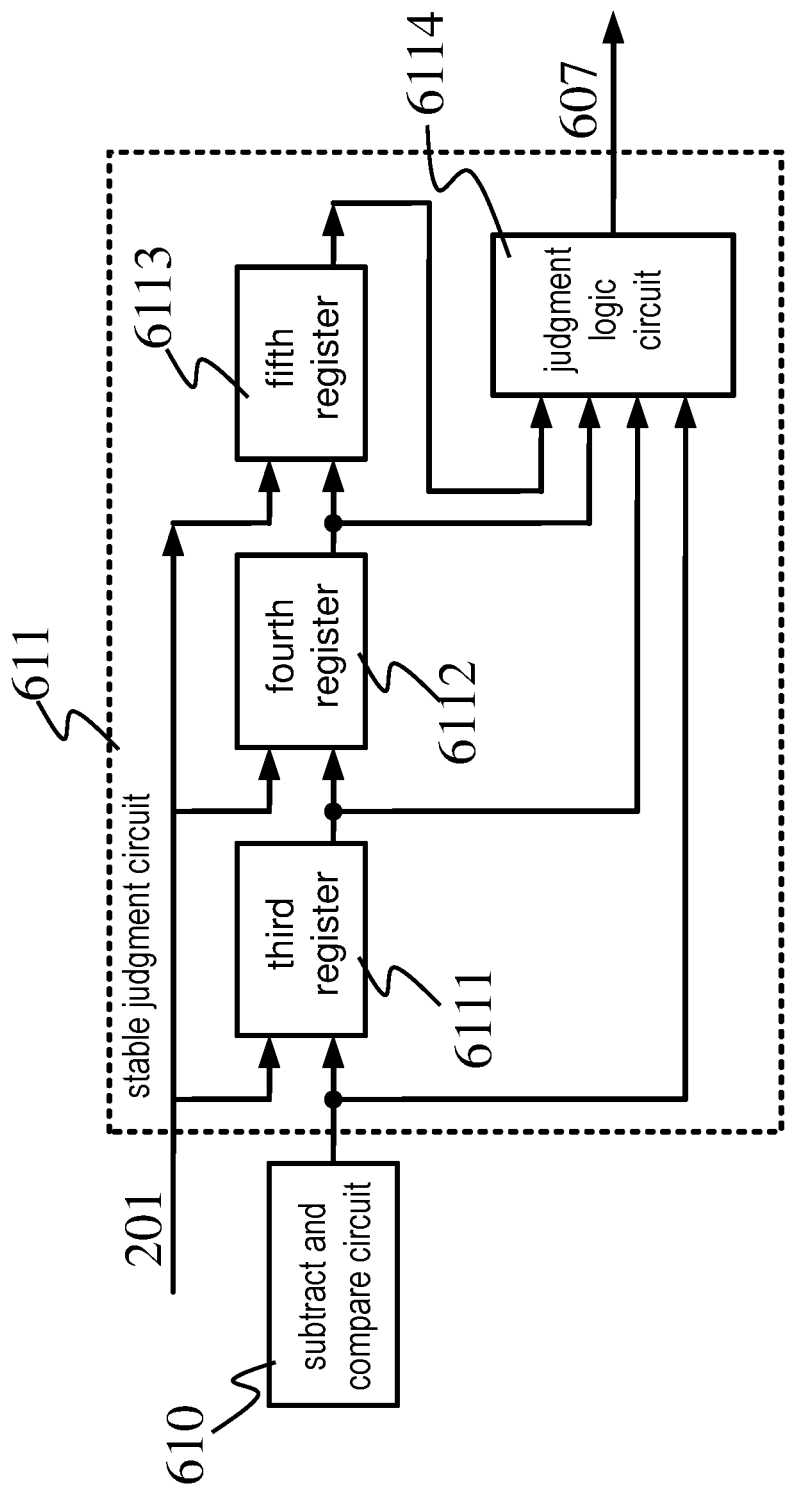
FIG. 5 illustrates a structure of the stable judgment circuit in FIG. 4.

In the analog-to-digital converter with an adjustable operation frequency, the stable processor 60 further includes a stable judgment circuit 611 having one or more registers in cascade, and a judgment logic circuit 6114, as shown in FIG. 5. Three registers are shown in FIG. 5, i.e., a third register 6111 for storing an output from the subtract and compare circuit 610 under control of the clock signal 201, a fourth register 6112 for storing an output from the third register 6111 under control of the clock signal 201, and a fifth register 6113 for storing an output from the fourth register 6112 under control of the clock signal 201. The judgment logic circuit 6114 generates a stable enable signal 607 based on an output from the subtract and compare circuit 610 and outputs from the registers 6111 to 6113 in the stable judgment circuit 611. If the subtraction result generated by the subtract and compare circuit 610 is higher than the stable threshold 604, the third multiplexer 606 selects an output from the stable calculator 605 as an input to the first register 608. Otherwise, the third multiplexer 606 selects the stable input signal 601 as an input to the first register 608.

According to the analog-to-digital converter with an adjustable operation frequency, the judgment logic circuit 6114 is operated as follows. When the subtraction result of the subtract and compare circuit 610 is higher than the stable threshold 604, the subtract and compare circuit 610 outputs digital logic "1" (high); otherwise, it outputs digital logic "0" (low). Therefore, in the case that the subtract and compare circuit 610 outputs digital logic "1", the third register 6111 receives digital logic "1" from the subtract and compare circuit 610 and outputs digital logic "1" for a period of the clock signal 201. The fourth register 6112 receives digital logic "1" from the third register 6111 and outputs digital logic "1" for a period of the clock signal 201. The fifth register 6113 receives digital logic "1" from the fourth register 6112 and outputs digital logic "1" for a period of the clock signal 201. The judgment logic circuit 6114 receives the outputs from the subtract and compare circuit 610, the third register 6111, the fourth register 6112 and the third register 6113, and then "OR" the outputs. Hence, the stable enable signal 607 will output digital logic "1" for four periods of the clock signal 201, which means that the outputs from the stable calculator 605 will be selected in the consecutive four periods to replace the stable output signal 602, thereby stabilizing the analog-to-digital conversion.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An analog-to-digital converter with an adjustable operation frequency, comprising:
   an analog-to-digital conversion unit for receiving an analog signal and converting the received analog signal into a digital quantized signal;
   a clock generator for generating a clock signal for controlling operation speed of said analog-to-digital conversion unit;
   a counter for calculating output times of said clock signal and generating a counting signal based on the calculated output times; and
   a clock controller for receiving a setting signal and said counting signal, generating a control signal for controlling said clock generator, and adjusting a frequency of said clock signal.

2. An analog-to-digital converter with an adjustable operation frequency according to claim 1,
   wherein said analog-to-digital conversion unit includes:
   a sample and hold circuit for sampling and holding said analog signal; and
   a quantizer for converting an output signal from said sample and hold circuit into said digital quantized signal.

3. An analog-to-digital converter with an adjustable operation frequency according to claim 1,
   wherein said analog-to-digital conversion unit includes:
   a sample and hold circuit for sampling and holding said analog signal;
   an integrator for integrating an output signal from said sample and hold circuit;
   a quantizer for converting an output signal from said integrator into said digital quantized signal; and
   a feedback circuit for generating a feedback signal based on said digital quantized signal and for controlling said sample and hold circuit.

4. An analog-to-digital converter with an adjustable operation frequency according to claim 1, further comprising a filter for filtering said digital quantized signal.

5. An analog-to-digital converter with an adjustable operation frequency according to claim 1, further comprising a stable processor for stabilizing said digital quantized signal.

6. An analog-to-digital converter with an adjustable operation frequency according to claim 5,
   wherein said stable processor has an input terminal fed with a stable input signal and an output terminal for outputting a stable output signal;
   wherein when said stable input signal is varied, said stable output signal is varied, or difference between said stable input signal and said stable output signal is varied, variation thereof is compared with a stable threshold; and
   wherein an intermediate signal ranging between said stable input signal and said stable output signal is obtained based on said stable input signal, said stable output signal and a stable ratio to replace said stable output signal when the variation is higher than said stable threshold.

7. An analog-to-digital converter with an adjustable operation frequency according to claim 6, wherein said stable threshold has a predetermined value or is obtained based on the variation.

8. An analog-to-digital converter with an adjustable operation frequency according to claim 5,
   wherein said stable processor has an input terminal fed with a stable input signal and an output terminal for outputting a stable output signal; and
   wherein an intermediate signal is obtained by subtracting said stable output signal from said stable input signal, dividing the subtraction result by a stable ratio, and adding the division result to said stable output signal, so as to replace said stable output signal.

9. An analog-to-digital converter with an adjustable operation frequency according to claim 5,
   wherein said stable processor includes:
   an input terminal fed with a stable input signal;
   an output terminal for outputting a stable output signal;
   a stable calculator for calculating an intermediate signal ranging between said stable input signal and said stable output signal based on said stable input signal, said stable output signal and a stable ratio;
   a third multiplexer for selecting and outputting either said stable input signal or an output from said stable calculator based on a stable enable signal;
   a first register for storing an output from said third multiplexer under control of said clock signal, and using either the output from said third multiplexer or an output from said first register as said stable output signal;
   a second register for storing said stable input signal under control of said clock signal; and
   a subtract and compare circuit for subtracting an output of said second register from said stable input signal, comparing the subtraction result with a stable threshold, and generating a stable enable signal; and wherein said third multiplexer selects the output from said stable calculator as an input to said first register when the subtraction result is higher than said stable threshold, or selects said stable input signal as an input to said first register when the subtraction result is equal to or lower than said stable threshold.

10. An analog-to-digital converter with an adjustable operation frequency according to claim 5, wherein said stable processor includes:

an input terminal having a stable input signal;

an output terminal having a stable output signal;

a stable calculator for calculating an intermediate signal ranging between said stable input signal and said stable output signal based on said stable input signal, said stable output signal and a stable ratio;

a third multiplexer for selecting and outputting either said stable input signal or an output from said stable calculator based on a stable enable signal;

a first register for storing an output from said third multiplexer under control of said clock signal, and using either the output from said third multiplexer or an output from said first register as said stable output signal;

a second register for storing said stable input signal under control of said clock signal;

a subtract and compare circuit for subtracting an output of said second register from said stable input signal, comparing the subtraction result with a stable threshold, and generating a comparison result; and a stable judgment circuit including one or more registers in cascade for storing an output from said subtract and compare circuit under control of said clock signal, and a judgment logic circuit for generating a stable enable signal based on the output from said subtract and compare circuit and outputs from said one or more registers; and wherein said third multiplexer selects the output from said stable calculator as an input to said first register when the subtraction result is higher than said stable threshold, or selects said stable input signal as an input to said first register when the subtraction result is equal to or lower than said stable threshold.

11. An analog-to-digital converter with an adjustable operation frequency according to claim 5, further comprising a filter for filtering said digital quantized signal, wherein said stable processor is connected to an end of said filter, or connected between said analog-to-digital conversion unit and said filter.

12. An analog-to-digital converter with an adjustable operation frequency according to claim 1, wherein said clock controller adjusts change rate or change amount of said control signal based on said counting signal and a selecting signal so as to generate a modulation signal, and receives an enable signal for selecting either said setting signal or said modulation signal as said control signal; and wherein said clock signal has a frequency gradually increasing or decreasing with time when said modulation signal is selected as said control signal, and said clock signal has a constant frequency when said setting signal is selected as said control signal.

13. An analog-to-digital converter with an adjustable operation frequency according to claim 12, further comprising a stable processor for stabilizing said digital quantized signal.

14. An analog-to-digital converter with an adjustable operation frequency according to claim 13, wherein said stable processor has an input terminal fed with a stable input signal and an output terminal for outputting a stable output signal;

wherein when said stable input signal is varied, said stable output signal is varied, or difference between said stable input signal and said stable output signal is varied, variation thereof is compared with a stable threshold; and wherein an intermediate signal ranging between said stable input signal and said stable output signal is obtained based on said stable input signal, said stable output signal and a stable ratio to replace said stable output signal when the variation is higher than said stable threshold.

15. An analog-to-digital converter with an adjustable operation frequency according to claim 14, wherein said stable threshold has a predetermined value or is obtained based on the variation.

16. An analog-to-digital converter with an adjustable operation frequency according to claim 13, wherein said stable processor has an input terminal fed with a stable input signal and an output terminal for outputting a stable output signal; and wherein an intermediate signal is obtained by subtracting said stable output signal from said stable input signal, dividing the subtraction result by a stable ratio, and adding the division result to said stable output signal, so as to replace said stable output signal.

17. An analog-to-digital converter with an adjustable operation frequency according to claim 13, wherein said stable processor includes:

an input terminal fed with a stable input signal;

an output terminal for outputting a stable output signal;

a stable calculator for calculating an intermediate signal ranging between said stable input signal and said stable output signal based on said stable input signal, said stable output signal and a stable ratio;

a third multiplexer for selecting and outputting either said stable input signal or an output from said stable calculator based on a stable enable signal;

a first register for storing an output from said third multiplexer under control of said clock signal, and using either the output from said third multiplexer or an output from said first register as said stable output signal;

a second register for storing said stable input signal under control of said clock signal; and a subtract and compare circuit for subtracting an output of said second register from said stable input signal, comparing the subtraction result with a stable threshold, and generating a stable enable signal; and wherein said third multiplexer selects the output from said stable calculator as an input to said first register when the subtraction result is higher than said stable threshold, or selects said stable input signal as an input to said first register when the subtraction result is equal to or lower than said stable threshold.

18. An analog-to-digital converter with an adjustable operation frequency according to claim 13, wherein said stable processor includes:

an input terminal having a stable input signal;

an output terminal having a stable output signal;

a stable calculator for calculating an intermediate signal ranging between said stable input signal and said stable output signal based on said stable input signal, said stable output signal and a stable ratio;
a third multiplexer for selecting and outputting either said stable input signal or an output from said stable calculator based on a stable enable signal;
a first register for storing an output from said third multiplexer under control of said clock signal, and using either the output from said third multiplexer or an output from said first register as said stable output signal;
a second register for storing said stable input signal under control of said clock signal;
a subtract and compare circuit for subtracting an output of said second register from said stable input signal, comparing the subtraction result with a stable threshold, and generating a comparison result; and
a stable judgment circuit including one or more registers in cascade for storing an output from said subtract and compare circuit under control of said clock signal, and a judgment logic circuit for generating a stable enable signal based on the output from said subtract and compare circuit and outputs from said one or more registers; and
wherein said third multiplexer selects the output from said stable calculator as an input to said first register when the subtraction result is higher than said stable threshold, or selects said stable input signal as an input to said first register when the subtraction result is equal to or lower than said stable threshold.

19. An analog-to-digital converter with an adjustable operation frequency according to claim 12,
wherein said clock controller includes:
a first multiplexer for outputting a modulation value based on said counting signal and said selecting signal;
an adder for adding said setting signal and said modulation value, thereby obtaining said modulation signal; and
a second multiplexer for selecting either said setting signal or said modulation signal as said control signal based on said enable signal.

20. An analog-to-digital converter with an adjustable operation frequency according to claim 19, further comprising a stable processor for stabilizing said digital quantized signal.

21. An analog-to-digital converter with an adjustable operation frequency according to claim 20,
wherein said stable processor has an input terminal fed with a stable input signal and an output terminal for outputting a stable output signal;
wherein when said stable input signal is varied, said stable output signal is varied, or difference between said stable input signal and said stable output signal is varied, variation thereof is compared with a stable threshold; and
wherein an intermediate signal ranging between said stable input signal and said stable output signal is obtained based on said stable input signal, said stable output signal and a stable ratio to replace said stable output signal when the variation is higher than said stable threshold.

22. An analog-to-digital converter with an adjustable operation frequency according to claim 21, wherein said stable threshold has a predetermined value or is obtained based on the variation.

23. An analog-to-digital converter with an adjustable operation frequency according to claim 20,
wherein said stable processor has an input terminal fed with a stable input signal and an output terminal for outputting a stable output signal; and
wherein an intermediate signal is obtained by subtracting said stable output signal from said stable input signal, dividing the subtraction result by a stable ratio, and adding the division result to said stable output signal, so as to replace said stable output signal.

24. An analog-to-digital converter with an adjustable operation frequency according to claim 20,
wherein said stable processor includes:
an input terminal fed with a stable input signal;
an output terminal for outputting a stable output signal;
a stable calculator for calculating an intermediate signal ranging between said stable input signal and said stable output signal based on said stable input signal, said stable output signal and a stable ratio;
a third multiplexer for selecting and outputting either said stable input signal or an output from said stable calculator based on a stable enable signal;
a first register for storing an output from said third multiplexer under control of said clock signal, and using either the output from said third multiplexer or an output from said first register as said stable output signal;
a second register for storing said stable input signal under control of said clock signal; and
a subtract and compare circuit for subtracting an output of said second register from said stable input signal, comparing the subtraction result with a stable threshold, and generating a stable enable signal; and
wherein said third multiplexer selects the output from said stable calculator as an input to said first register when the subtraction result is higher than said stable threshold, or selects said stable input signal as an input to said first register when the subtraction result is equal to or lower than said stable threshold.

25. An analog-to-digital converter with an adjustable operation frequency according to claim 20,
wherein said stable processor includes:
an input terminal having a stable input signal;
an output terminal having a stable output signal;
a stable calculator for calculating an intermediate signal ranging between said stable input signal and said stable output signal based on said stable input signal, said stable output signal and a stable ratio;
a third multiplexer for selecting and outputting either said stable input signal or an output from said stable calculator based on a stable enable signal;
a first register for storing an output from said third multiplexer under control of said clock signal, and using either the output from said third multiplexer or an output from said first register as said stable output signal;
a second register for storing said stable input signal under control of said clock signal;
a subtract and compare circuit for subtracting an output of said second register from said stable input signal, comparing the subtraction result with a stable threshold, and generating a comparison result; and
a stable judgment circuit including one or more registers in cascade for storing an output from said subtract and compare circuit under control of said clock signal, and a judgment logic circuit for generating a stable enable signal based on the output from said subtract and compare circuit and outputs from said one or more registers; and wherein said third multiplexer selects the output from said stable calculator as an input to said first register when the subtraction result is higher than said stable threshold, or selects said stable input signal as an input to said first register when the subtraction result is equal to or lower than said stable threshold.

\* \* \* \* \*